(12) United States Patent
Park et al.

(10) Patent No.: US 7,768,042 B2
(45) Date of Patent: Aug. 3, 2010

(54) THIN FILM TRANSISTOR INCLUDING TITANIUM OXIDES AS ACTIVE LAYER AND METHOD OF MANUFACTURING THE SAME

(75) Inventors: Jae-Woo Park, Daejeon (KR); Seunghyup Yoo, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 12/058,399

(22) Filed: Mar. 28, 2008

(65) Prior Publication Data
US 2008/0237595 A1 Oct. 2, 2008

(30) Foreign Application Priority Data
Mar. 29, 2007 (KR) .............. 10-2007-0031144
Oct. 9, 2007 (KR) .............. 10-2007-0101638

(51) Int. Cl.
*H01L 29/80* (2006.01)
(52) U.S. Cl. .............. 257/262; 257/288; 257/377; 257/382; 257/E21.019
(58) Field of Classification Search .............. 257/288, 257/401, 901, 262, 368, 371, 376, 377, 382
See application file for complete search history.

(56) References Cited
U.S. PATENT DOCUMENTS
2002/0106861 A1* 8/2002 Yamazaki .............. 438/308
2005/0274986 A1* 12/2005 Sirringhaus et al. .......... 257/213
2006/0231829 A1* 10/2006 Wu et al. .............. 257/40
2006/0270236 A1* 11/2006 Kusumoto et al. .......... 438/692
2007/0221926 A1* 9/2007 Lee et al. .............. 257/79
2008/0210934 A1* 9/2008 Koinuma et al. .............. 257/43

FOREIGN PATENT DOCUMENTS
JP 03-232222 10/1991
KR 1999-0074247 10/1999
WO WO 2006/103853 10/2006

* cited by examiner

*Primary Examiner*—Wai-Sing Louie
(74) *Attorney, Agent, or Firm*—KED & Associates, LLP

(57) ABSTRACT

Disclosed herein is a method of manufacturing a thin film transistor including titanium oxides as an active layer and the structure of the thin film transistor film manufactured using the method. The thin film transistor includes: a substrate; an active layer formed on the substrate using polycrystalline or amorphous titanium oxides; and an insulating layer formed on the active layer. Further, the method of manufacturing the thin film transistor includes: forming a substrate; forming an active layer on the substrate using polycrystalline or amorphous titanium oxides; and forming an insulating layer on the active layer. The present invention is advantageous in that the performance of the thin film transistor can be improved, the thin film transistor can be manufactured at low cost, harmful environmental problems can be solved, and the thin film transistor can be widely applied to various electronic apparatuses including, but not limited to, integrated drivers in active-matrix displays and transparent electronic devices.

25 Claims, 10 Drawing Sheets

THIN FILM TRANSISTOR INCLUDING TITANIUM OXIDES AS ACTIVE LAYER AND METHOD OF MANUFACTURING THE SAME

BACKGROUND OF THE INVENTION

1. Field of the Invention

The present invention relates to a thin film transistor including titanium oxides as an active layer, and especially to its structure and a method of manufacturing the same, which can be used for low-cost production of a thin film transistor, have a potential to solve harmful environmental problems, improve the performance of a thin film transistor, and can be widely applied to specific electronic apparatuses.

2. Description of the Related Art

Recently, multipurpose displays, which are lightweight, can be increased in size on demand, and can be reduced for easier storage when they are not in use, have attracted a considerable attention in consideration of the benefits such as portability and bidirectional communication. In particular, flexible displays based on organic electroluminescence displays (OLEDs), liquid crystal displays (LCDs), electrophoretic displays, and the like are being developed.

Organic thin film transistors are particularly attracting attention as driving circuitries in such flexible displays. Organic semiconductors used for organic thin film transistors are mechanically flexible compared to silicon semiconductors. Organic semiconductors have a charge mobility of about 0.001~several ones $cm^2/Vsec$, and thus are limitedly used only in displays that do not require much current.

Organic thin film transistors have limited current driving capability due to their limited charge mobility. The current driving capability of organic thin film transistors can be increased to some degree by increasing the ratio of width to length in a channel, but, in this case, there is a problem in that the aperture ratio, which is the ratio of light-emitting area to the total area of a pixel, decreases.

Furthermore, since organic semiconductors are weakly resistant to oxygen or moisture in the air, it is difficult to realize perfect packaging. Since a flexible substrate has much higher transmissivity of oxygen and moisture than a glass substrate, etc., it is even more challenging to realize a perfect packaging for flexible displays using organic thin film transistors.

Meanwhile, important transistor technologies include amorphous silicon transistors and low-temperature polysilicon transistors. The amorphous silicon transistors are problematic in that they have low charge mobility and their threshold voltages drift over time. Low-temperature polysilicon transistors are also problematic in that they cannot be used together with plastic substrates that must be handled at temperatures much lower than the processing temperature of low-temperature polysilicon.

In order to overcome the above problems, transistors based on metal-oxide semiconductors, particularly those based on zinc oxide (ZnO) or its compounds, have been proposed. However, in order to realize a high charge mobility in such metal-oxide transistors, expensive metals, such as indium (In), tin (Sn), gallium (Ga), and the like, are added thereto.

Such metal-oxide thin film transistors (MOxTFT) have lately attracted considerable attention as alternatives to silicon semiconductor-based TFTs and organic semiconductor-based transistors because they can realize an ideal balance between cost, performance and processability in the application fields like active matrix displays, radio frequency identification (RFID) tags, and the like. Further, these MOxTFTs are expected to be applied to new applications in which transparency is required or desired.

However, as described above, almost all MOxTFTs have been fabricated based on ZnO or mixtures thereof to date. Moreover, since most successful MOxTFTs are mixed with indium, there is a problem in that the material costs and processing costs are high. This presents a great impediment to use in the fields of extremely low-priced goods, such as RFID tags and the like.

Therefore, efforts have to be made to find novel base materials for realizing thin film transistors with excellent performance and suitable prices and to develop the structures of thin film transistors using the found base materials and methods of manufacturing the same.

SUMMARY OF THE INVENTION

Accordingly, the present invention has been made in an effort to solve the above problems occurring in the prior art, and an object of the present invention is (i) to provide a method of manufacturing a thin film transistor including titanium oxides as an active layer, which can be manufactured at very low cost by using polycrystalline or amorphous titanium oxides, which are abundant on the earth, very easy to form into a thin film, and thus into an active layer of a thin film transistor, and (ii) to provide the structure of the titanium-oxide based thin film transistors manufactured using the method.

Another object of the present invention is to provide a method of manufacturing a thin film transistor including titanium oxides as an active layer, which can solve the harmful environmental problems of conventional thin film transistors by forming titanium oxides, which are environment-friendly materials, into an active layer of a thin film transistor, and the structure of the thin film transistor manufactured using the method.

A further object of the present invention is to provide a method of manufacturing a thin film transistor including titanium oxides as an active layer, which can improve the performance of a thin film transistor, including high charge mobility and stability to air or moisture, by forming titanium oxides into an active layer of a thin film transistor, and the structure of the thin film transistor manufactured using the method.

A still further object of the present invention is to provide a method of manufacturing a thin film transistor including titanium oxides as an active layer, which can be widely applied to specific electronic apparatuses in which electronic should be invisible, by forming transparent titanium oxides into an active layer of a thin film transistor, and the structure of the thin film transistor manufactured using the method.

In order to accomplish the above objects, a thin film transistor according to an aspect of the present invention provides a thin film transistor, including a substrate, an active layer formed on the substrate using polycrystalline or amorphous titanium oxides, and an insulating layer formed on the active layer.

In order to accomplish the above objects, a thin film transistor according to another aspect of the present invention provides a thin film transistor, including a substrate, an insulating layer formed on the substrate, and an active layer formed on the insulating layer using polycrystalline or amorphous titanium oxides.

In order to accomplish the above objects, a thin film transistor according to a further aspect of the present invention provides a thin film transistor, including a substrate, and an active layer formed on the substrate using polycrystalline or amorphous titanium oxides.

In order to accomplish the above objects, a method of manufacturing a thin film transistor according to a still further aspect of the present invention provides a method of manufacturing a thin film transistor, including: forming a substrate, forming an active layer on the substrate using polycrystalline or amorphous titanium oxides, and forming an insulating layer on the active layer.

In order to accomplish the above objects, a method of manufacturing a thin film transistor according to a still further aspect of the present invention provides a method of manufacturing a thin film transistor, including: forming a substrate, forming an insulating layer on the substrate, and forming an active layer on the insulating layer using polycrystalline or amorphous titanium oxides.

In order to accomplish the above objects, a method of manufacturing a thin film transistor according to a still further aspect of the present invention provides a method of manufacturing a thin film transistor, including: forming a substrate, and forming an active layer on the substrate using polycrystalline or amorphous titanium oxides.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1A:
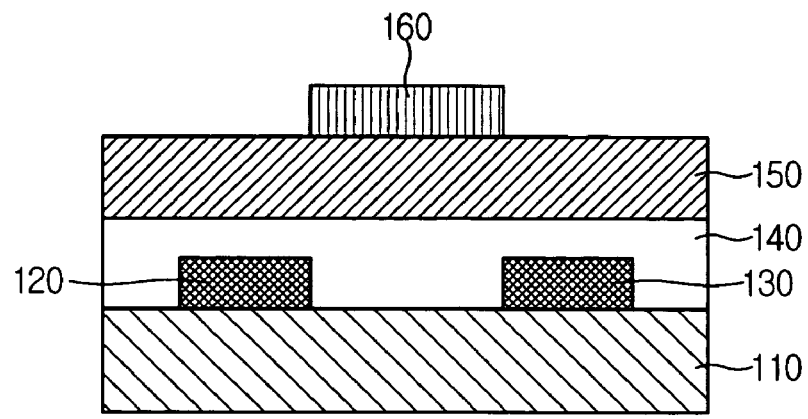
FIGS. 1A to 1D are sectional views showing structures of metal insulator semiconductor field effect transistors (MISFETs) according to an embodiment of the present invention.

Hereinafter, preferred embodiments of the present invention will be described in detail with reference to the attached drawings.

Reference now should be made to the drawings, in which the same reference numerals are used throughout the different drawings to designate the same or similar components.

The present invention provides a method of forming titanium oxides into an amorphous active layer of a thin film transistor. Titanium oxides, which are all kinds of oxides formed by oxidizing titanium, are represented by $TiO_x$ ($0<x\leq2$), for example, $TiO_2$, $TiO$, etc.

The thin film transistors according to an embodiment of the present invention may be classified into metal insulator semiconductor field effect transistors (MISFETs) having an insulating layer and metal semiconductor field effect transistors (MESFETs) having no insulating layer.

The thin film transistor according to an embodiment of the present invention may include all or some of a substrate, an active layer, an insulating layer, a gate electrode, a source electrode, and a drain electrode. Therefore, in the present invention, various types of thin film transistors may be formed depending on the combination of the constituents.

First, the structures of metal insulator semiconductor field effect transistors (MISFETs) having insulating layers will be described in detail with reference to FIGS. 1A to 1D.

FIGS. 1A to 1D are sectional views showing the structures of the metal insulator semiconductor field effect transistors (MISFETs) according to an embodiment of the present invention.

As shown in FIG. 1A, in a thin film transistor according to an embodiment of the present invention, a source electrode 120 and a drain electrode 130 may be formed on a substrate 110. An active layer 140 may be formed on the substrate 110, provided thereon with the source electrode 120 and the drain electrode 130.

In this case, as the substrate 110, a silicon substrate, a semiconductor substrate, a glass substrate, a plastic substrate, metal foil, fabric, paper, or the like may be used.

Subsequently, an insulating layer 150 may be formed on the active layer 140, and a gate electrode 160 may be formed on the insulating layer 150. Here, the width of the gate electrode 160 may be a little greater than the distance between the source electrode 120 and the drain electrode 130.

The reason for this is that, although it is ideal if the width of the gate electrode 160 is identical to the distance between the source electrode 120 and the drain electrode 130, in reality, a margin must be provided from the point of view of the manufacture thereof.

In this case, it is proposed in the present invention that titanium oxides be formed into a polycrystalline or amorphous active layer using various conventional coating methods. That is, the active layer 140 may be formed from solution by applying a colloidal solution in which titanium oxide particles are dispersed or a sol-gel solution including titanium oxide precursors on the substrate 110 provided thereon with the source electrode 120 and the drain electrode 130 using spin coating, dip coating, nano-imprinting, stamping, printing, transfer printing, self-assembly, and the like. Further, the active layer 140 may also be formed by depositing from gaseous or solid-state titanium oxides or titanium oxide precursors on the substrate 110 provided thereon with the source electrode 120 and the drain electrode 130 using chemical vapor deposition, laser deposition, thermal evaporation, electron beam evaporation, sputtering, atomic layer deposition, pulsed laser deposition (PLD), and the like.

The reason why titanium oxides are formed preferably into a polycrystalline or amorphous active layer is that it is difficult to form titanium oxides into a single-crystalline active layer, it is difficult to produce transistors having the single-crystalline active layer in large quantities, and it is difficult to integrate the transistors having the single-crystalline active layer into other electronic devices and to utilize them in flexible electronic apparatuses.

Further, the titanium oxide active layer 140, which is natively n-type in most cases, may be tuned to be more or less conductive or even turned into p-type by adding or mixing with suitable impurities as in conventional semiconductor doping methods. Furthermore, the titanium oxide active layer 140 may be formed by mixing other oxides or metals, for example, $SnO_2$, InO, ZnO, Al, and the like, with titanium oxides at a predetermined ratio.

The reason for that is that the performance of the thin film transistor including the titanium oxide active layer can be improved.

Figure 1B:
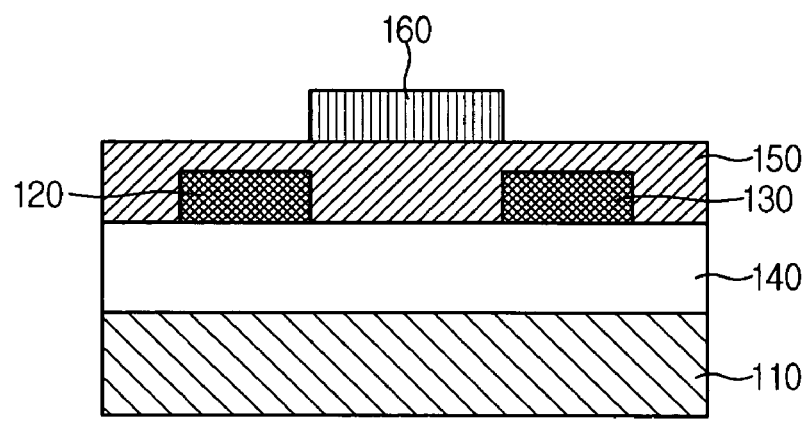

As shown in FIG. 1B, in a thin film transistor according to an embodiment of the present invention, an active layer 140 may be formed on a substrate 110. A source electrode 120 and a drain electrode 130 may be formed on the active layer 140. An insulating layer 150 may be formed on the active layer 140 provided thereon with the source electrode 120 and the drain electrode 130. Subsequently, a gate electrode 160 may be formed on the insulating layer 150.

Figure 1C:
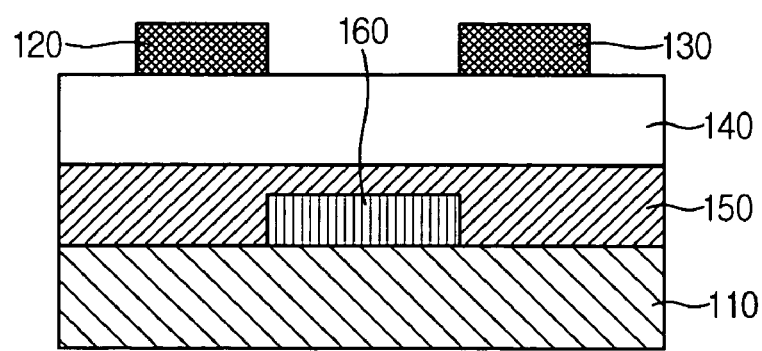

As shown in FIG. 1C, in a thin film transistor according to an embodiment of the present invention, a gate electrode 160 may be formed on a substrate 110. An insulating layer 150 may be formed on the substrate 110 provided thereon with the gate electrode 160. An active layer 140 may be formed on the insulating layer 150. Subsequently, a source electrode 120 and a drain electrode 130 may be formed on the active layer 140.

Figure 1D:
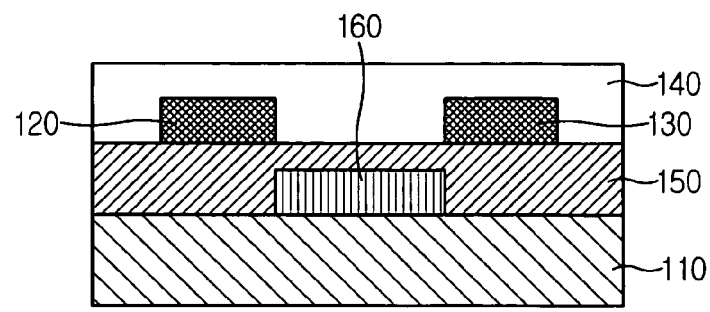

As shown in FIG. 1D, in a thin film transistor according to an embodiment of the present invention, a gate electrode 160 may be formed on a substrate 110. An insulating layer 150 may be formed on the substrate 110 provided thereon with the gate electrode 160. A source electrode 120 and a drain electrode 130 may be formed on the insulating layer 150. Subsequently, an active layer 140 may be formed on the insulating layer 150 provided thereon with the source electrode 120 and the drain electrode 130.

Next, the structures of metal semiconductor field effect transistors (MESFETs) having no insulating layer will be described in detail with reference to FIGS. 2A to 2D.

FIGS. 2A to 2D are sectional views showing the structures of the metal semiconductor field effect transistors (MESFETs) according to an embodiment of the present invention.

Figure 2A:
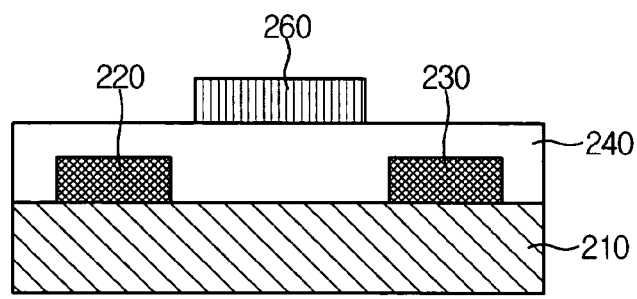
FIGS. 2A to 2D are sectional views showing structures of metal semiconductor field effect transistors (MESFETs) according to an embodiment of the present invention.

As shown in FIG. 2A, in a thin film transistor according to an embodiment of the present invention, a source electrode 220 and a drain electrode 230 may be formed on a substrate 210. An active layer 240 may be formed on the substrate 210 provided thereon with the source electrode 220 and the drain electrode 230.

Subsequently, a gate electrode 260 may be formed on the active layer 240. Here, the distance between the source electrode 220 and the drain electrode 230 may be the same as or larger than the width of the gate electrode 260.

Figure 2B:
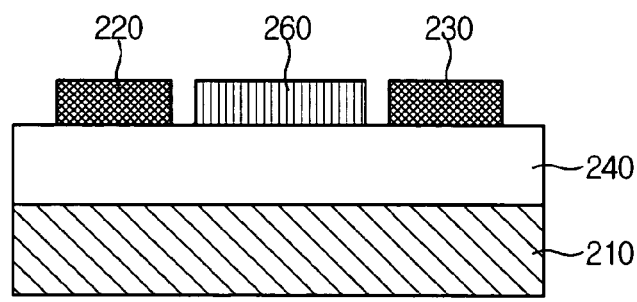

As shown in FIG. 2B, in a thin film transistor according to an embodiment of the present invention, an active layer 240 may be formed on a substrate 210. A gate electrode 260 may be formed on the active layer 240. Subsequently, a source electrode 220 and a drain electrode 230 may be formed on the active layer 240 such that they are disposed at one side and the other side of the gate electrode 260, respectively, at certain intervals.

Figure 2C:
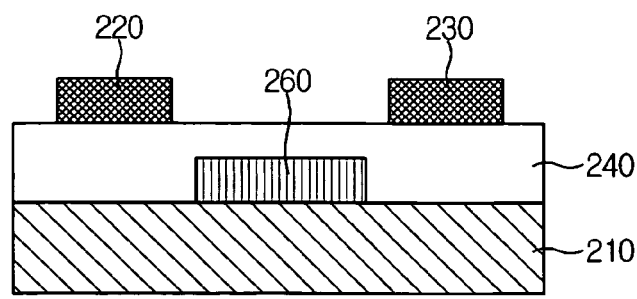

As shown in FIG. 2C, in a thin film transistor according to an embodiment of the present invention, a gate electrode 260 may be formed on a substrate 210. An active layer 240 may be formed on the substrate 210 provided thereon with the gate electrode 260. Subsequently, a source electrode 220 and a drain electrode 230 may be formed on the active layer 240.

Figure 2D:
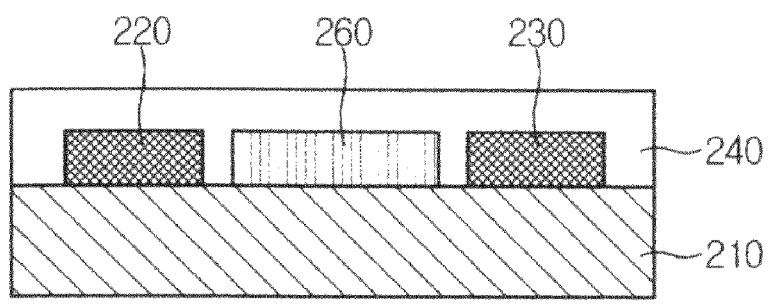

As shown in FIG. 2D, in a thin film transistor according to an embodiment of the present invention, a gate electrode 260 may be formed on a substrate 210. A source electrode 220 and a drain electrode 230 may be formed on the substrate 210 such that they are disposed at one side and the other side of the gate electrode 260 at certain intervals, respectively. Subsequently, an active layer 240 may be formed on the substrate 210, provided thereon with the gate electrode 260, source electrode 220 and drain electrode 230.

The principle for manufacturing a thin film transistor having an active layer, particularly a $TiO_2$ active layer, a $TiO_2$ active channel or a $TiO_2$ active channel layer, and the test results thereof will be described with reference to FIGS. 3A to 7D.

The present invention provides a novel and cheap transparent metal-oxide thin film transistor (MOxTFT), manufactured based on a $TiO_2$ active channel layer formed through a solution process. It was found in a real test that n-type TFTs having a charge mobility of 0.12 $cm^2V^{-1}$ $sec^{-1}$ and a threshold voltage of 11 V can be realized by conducting an additional process of diffusing Ti into a $TiO_2$ channel layer. The present invention can also provide a method of extending the scope of the raw material for MOxTFTs and improving their performance in general.

Titanium dioxide ($TiO_2$) can be produced at low cost in large quantities, and is used in various fields such as pigments, UV-absorbers in cosmetics, photocatalysts, optical coating agents, gas sensors, and the like. Further, titanium dioxide ($TiO_2$) is also being researched in electronics for use as a high-k insulator for manufacturing TFTs, and as an electron transport layer of dye-sensitized cells or organic solar cells.

However, it has never been reported that TFTs were actually realized using $TiO_2$ as a raw material for an active channel. The present inventors paid attention to the technical and economical potentials that can be expected when TFTs are realized by applying titanium oxides to an active channel layer thereof, based on the facts that $TiO_2$ is similar to ZnO in the aspect of electron energy bands, such as energy gap, conduction band and valence band, exhibits high hole mobility, can be produced at low cost in large quantities, and can be used in various application fields, as noted above. As a result, the present invention was completed.

It can be seen that, since $TiO_2$ has high resistivity and high trap density, it is difficult in practice to realize effective transistors using $TiO_2$ thin films or $TiO_2$ single crystals. In particular, when the trap density of $TiO_2$ is high, most of the gate voltage-induced carriers cannot efficiently become free carriers, and thus it is very important to decrease the unfilled trap density in channel layers. Both the resistivity and unfilled trap density of $TiO_2$ can be decreased by externally doping charge carriers.

The resistivity of titanium oxides can be widely adjusted from that of insulators ($10^{12}$ Ω cm) to that of conductors (0.001~1 Ω cm) through factors such as oxygen vacancy, Ti-interstitials, dopants, and the like. Since films that are resistive or too conductive are not suitable for TFT active channels, in order to realize actually applicable TFTs, an easy process of controlling the optimal doping level must be established.

As such, the active layer according to the present invention may be formed using the titanium oxides formed by diffusing Ti atoms into titanium oxides. In addition, the active layer according to the present invention may also be formed by controlling only the oxygen vacancy of titanium oxides without performing the process of diffusing Ti into titanium oxides.

Figure 3A:
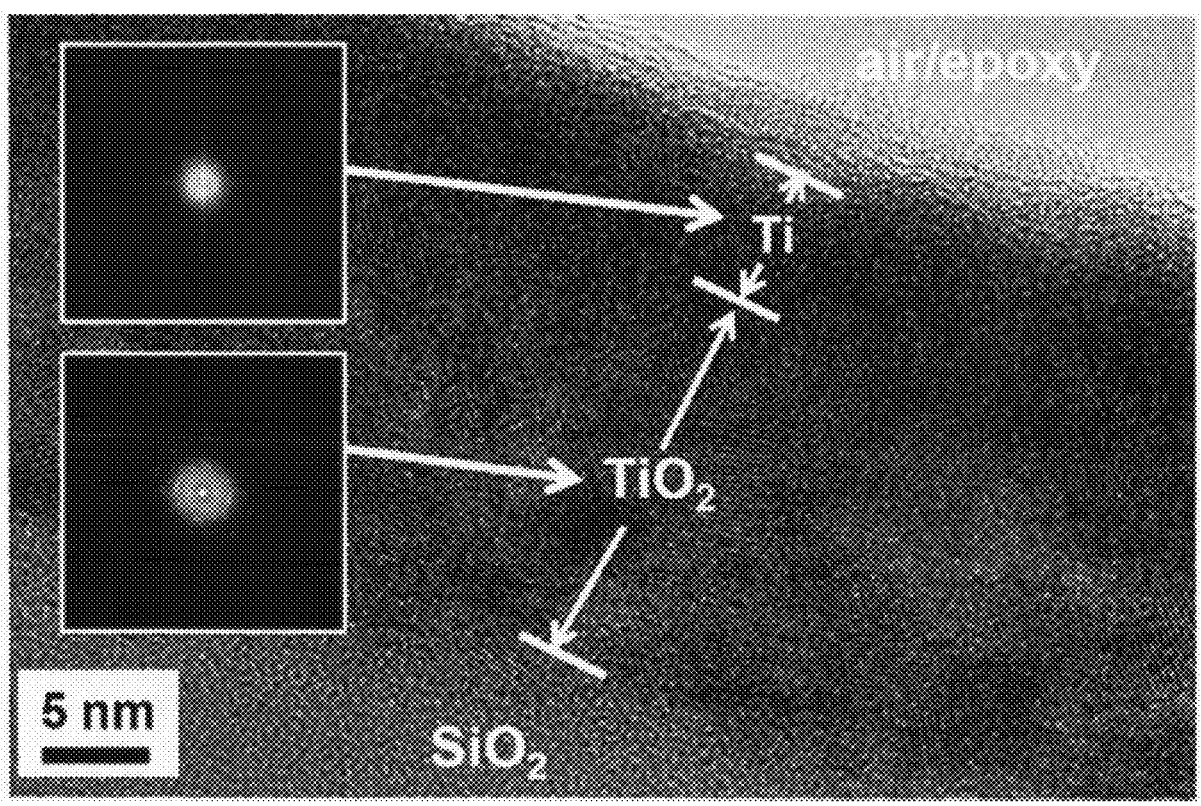
FIGS. 3A to 3B are views illustrating the test results for diffusion procedures according to an embodiment of the present invention.
Figure 3B:
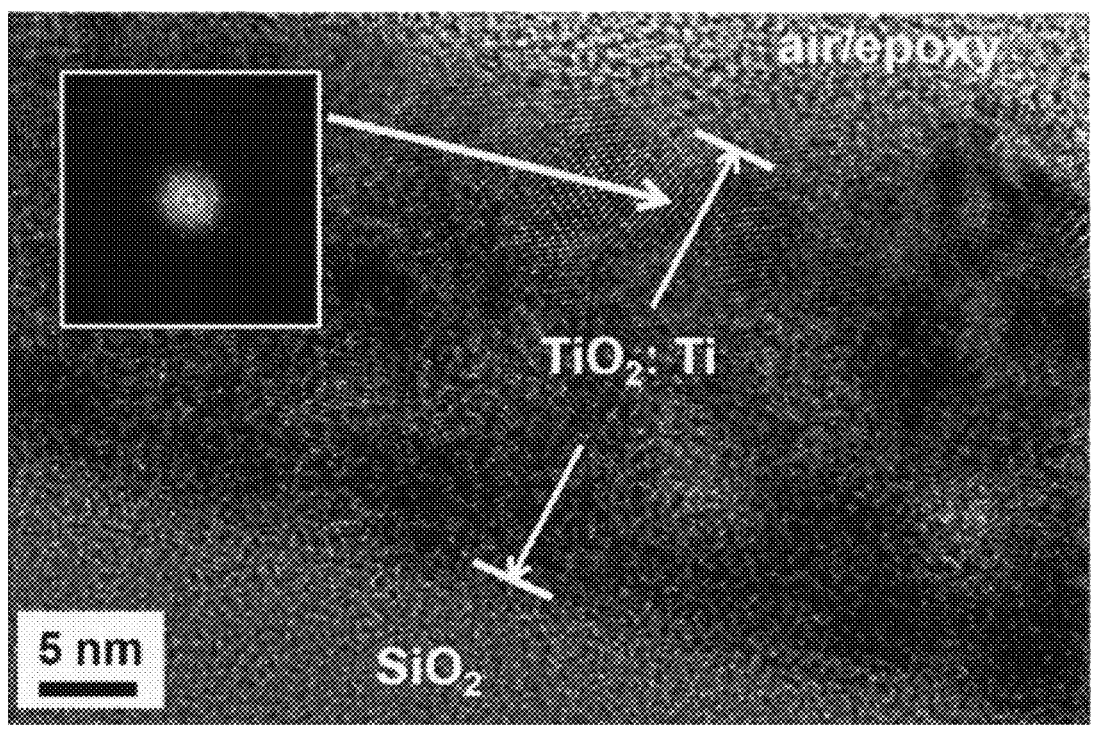
Figure 6:
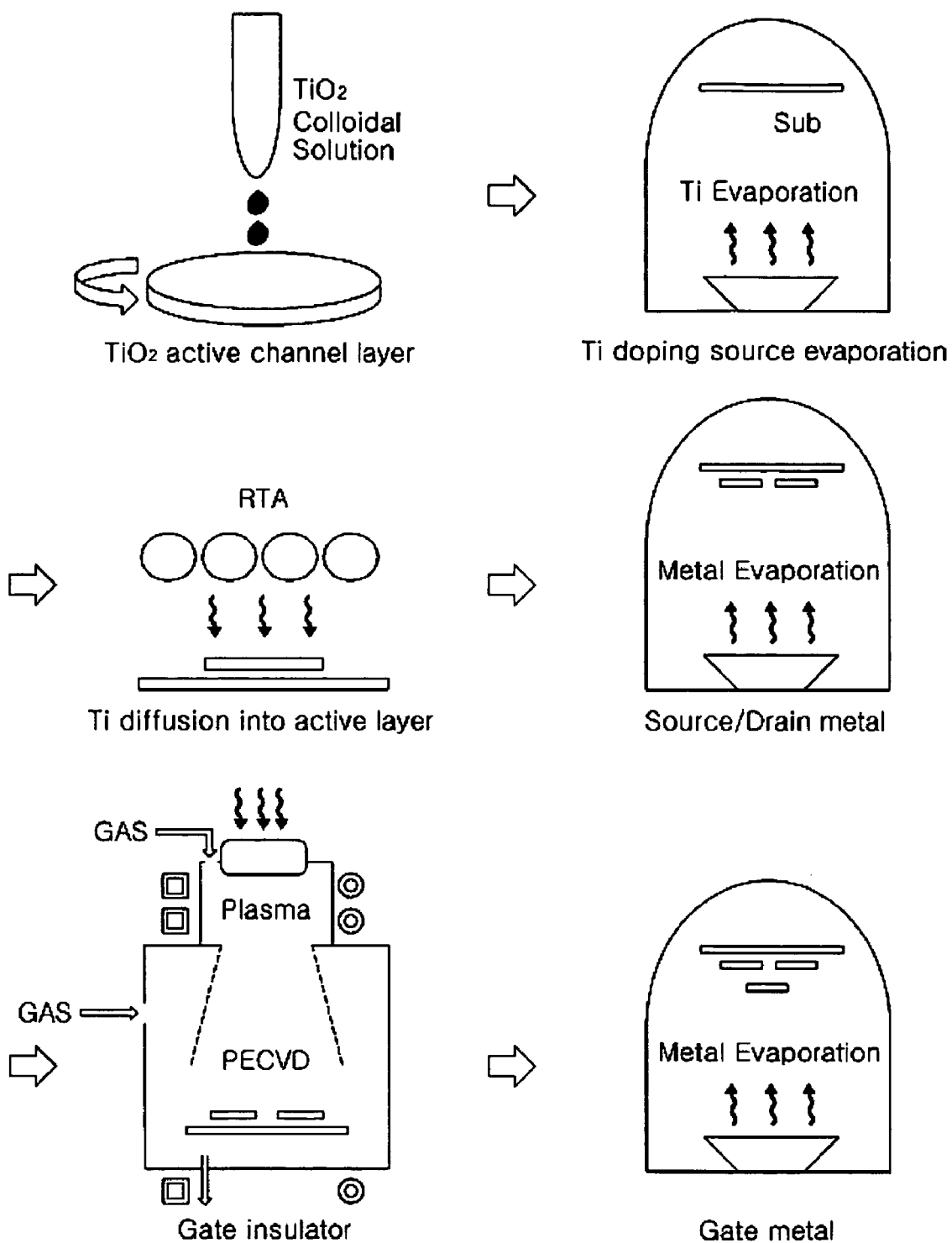
FIG. 6 is a view illustrating a process of manufacturing a TFT according to an embodiment of the present invention.

Therefore, as shown in FIG. 6, the present invention provides a method of obtaining a Ti-doped $TiO_2$ film, including: applying a $TiO_2$ nanoparticle colloidal solution on a $SiO_2$ (100 nm)/Si substrate or a glass substrate through a spin coating process twice to form a thin $TiO_2$ layer (20~30 nm); forming a very thin Ti layer (1~10 nm) on the $TiO_2$ layer through a thermal evaporation process; treating the TiO$_2$ layer and Ti layer at a temperature of 550° C.~800° C. for several minutes through a rapid thermal annealing (RTA) process to diffuse Ti into the TiO$_2$ layer. As shown in FIGS. 3A and 3B, comparing a high resolution transmission electron microscopy (HRTEM) image of a Ti/TiO$_2$ layer before RTA (FIG. 3A) with that of a Ti/TiO$_2$ layer after RTA (FIG. 3B), a Ti layer having a thickness of about 7 nm exists before RTA, but disappears after RTA (550° C., 4 minutes). For this reason, it can be seen that Ti atoms are diffused into the TiO$_2$ layer after RTA.

FIGS. 3A to 3B are views illustrating test results for diffusion procedures according to an embodiment of the present invention.

As shown in FIGS. 3A to 3B, a Ti layer is clearly distinguished from a TiO$_2$ layer before RTA (FIG. 3A). That is, the Ti layer shown in the upper portion of FIG. 3A has a selected electron diffraction (SED) pattern typical of amorphous phase. In contrast, the TiO$_2$ layer, shown in the lower portion of FIG. 3A, has a SED pattern typical of polycrystalline phase.

After the RTA, the Ti layer is not seen separably from the TiO$_2$ layer, and the SED pattern of the upper portion of the Ti/TiO$_2$ layer is not that of an amorphous phase anymore (FIG. 3B).

Comparing the UV/VIS optical transmission data of Ti(1 nm)/TiO$_2$ (25 nm) formed on a glass substrate before RTA with those of Ti(1 nm)/TiO$_2$(25 nm) formed on a glass substrate after RTA, one can find a clear difference therebetween, and it is described with reference to FIG. 4.

Figure 4:
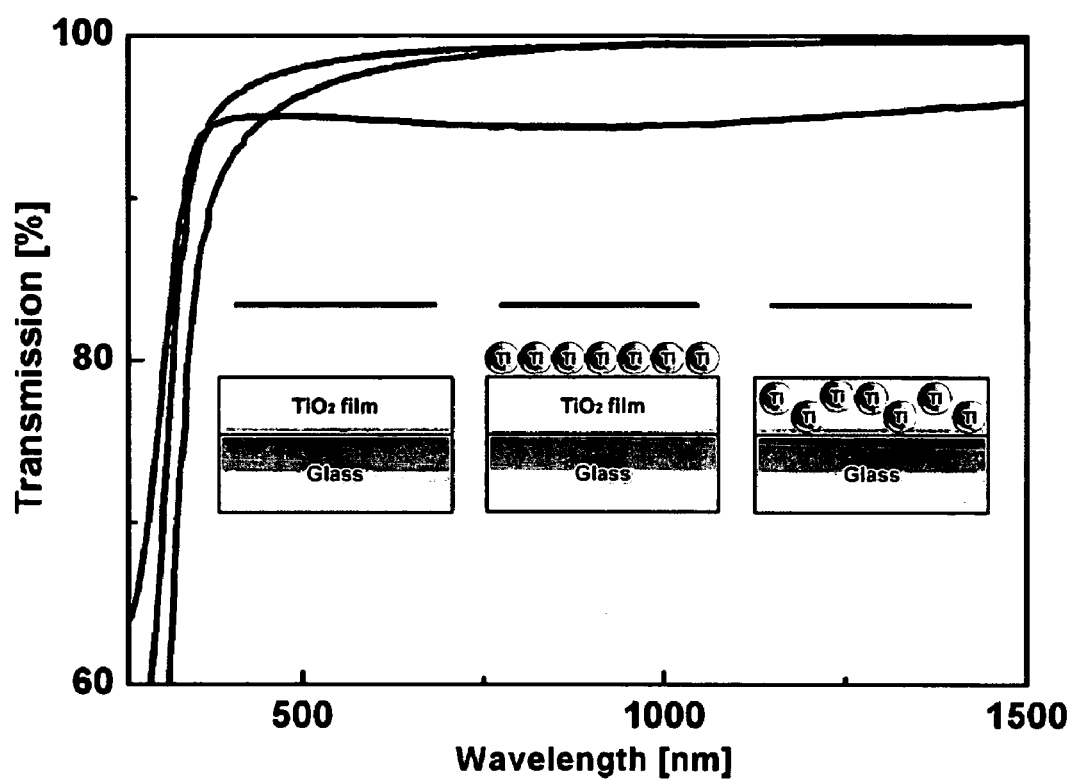
FIG. 4 is a graph showing the test results explaining changes in optical characteristics according to an embodiment of the present invention.

FIG. 4 is a graph showing test results explaining changes in optical characteristics according to an embodiment of the present invention.

As shown in FIG. 4, although the transmission of a pure TiO$_2$ layer is about 98% in the visible light range, the transmission of a Ti/TiO$_2$ layer before RTA is decreased from 98% to 94% because a Ti layer placed on the surface of the TiO$_2$ layer reflects light. However, a TiO$_2$ layer into which Ti is diffused through RTA exhibits high transmission, the same as that of a pure TiO$_2$ layer. Further, the Ti-diffused TiO$_2$ layer begins to absorb light at a wavelength corresponding to energy 0.4 eV less than that (3.4 eV) of the pure TiO$_2$ layer. From the former, it can be seen that Ti is diffused into a TiO$_2$ layer through RTA without remaining as an additional layer. From the latter, it can be seen that the donor energy level is formed due to the diffusion of Ti.

The structure of a TFT realized using the above Ti-diffusion phenomenon and the manufacturing principle thereof will be described in detail with reference to FIGS. 5A to 6.

Figure 5A:
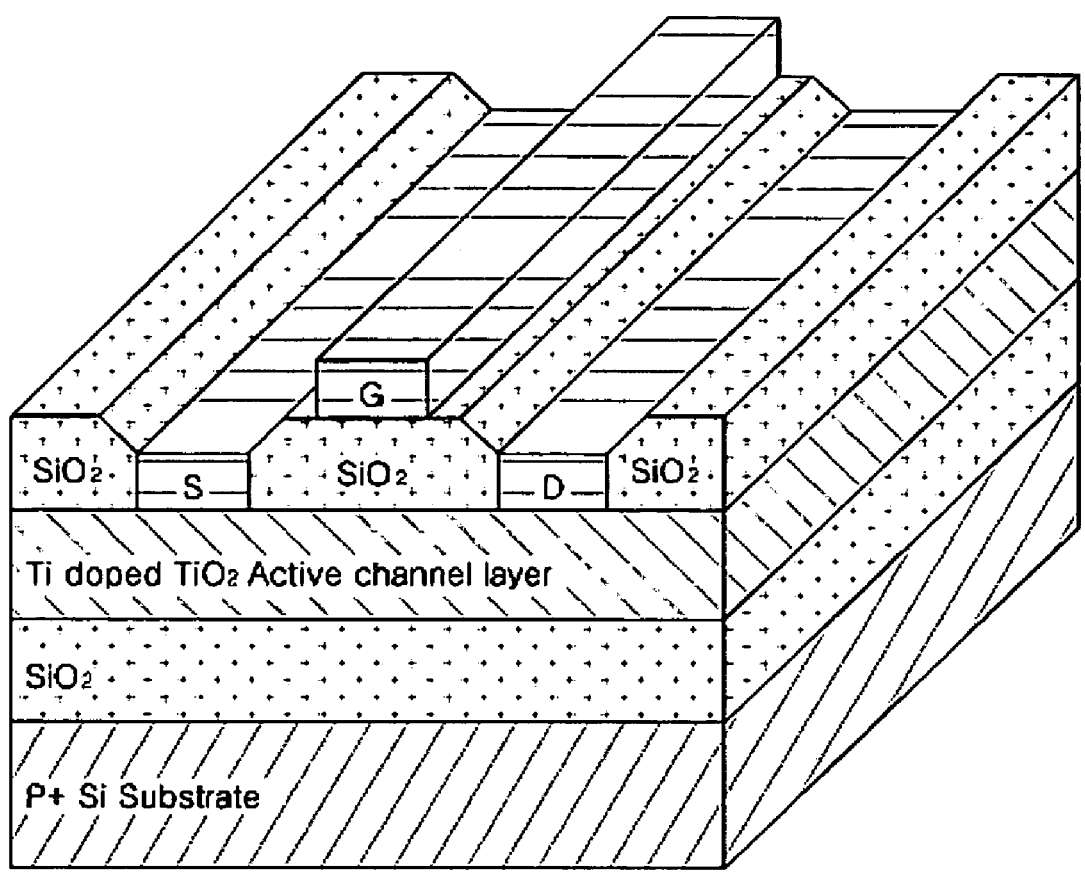
FIGS. 5A to 5B are views illustrating a TFT having a top-gate structure according to an embodiment of the present invention.
Figure 5B:
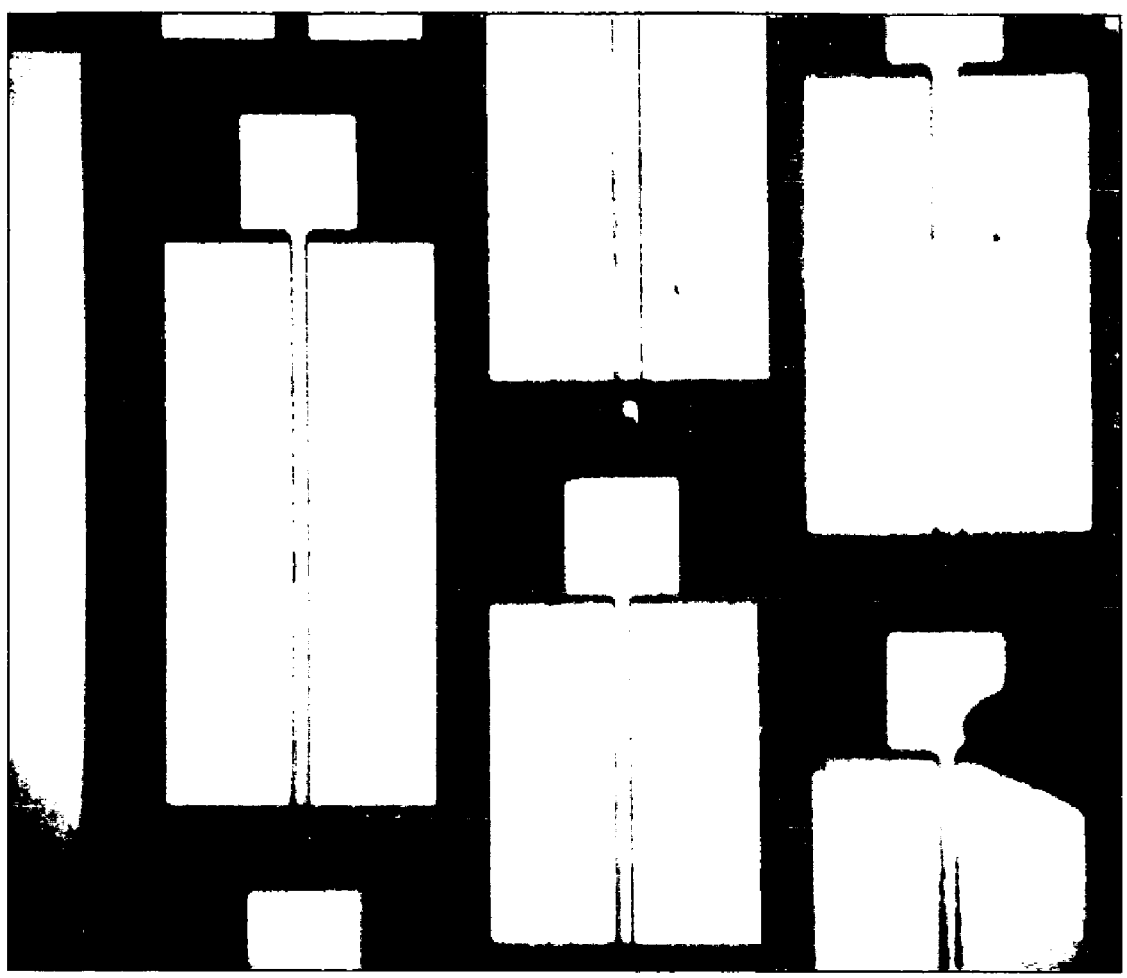

FIGS. 5A to 5B are views illustrating a TFT having a top-gate structure according to an embodiment of the present invention.

As described above, a TiO$_2$ channel layer, shown in FIGS. 5A to 5B, can be simply formed on a substrate using a series of process including spin coating, Ti deposition, and RTA. In FIGS. 5A to 5B, the TiO$_2$ channel layer is formed on a Si wafer including a 100 nm-thick thermally grown silicon oxide on its top. In this case, the thermally grown silicon dioxide layer is only used as a dummy insulating layer. Various kinds of substrates, such as a glass substrate, etc., may be used as long as they are not damaged at an RTA temperature of 550° C.~800° C.

Subsequently, a Ti(5 nm)/Au(150 nm) layer is formed for the purpose of source/drain contact through thermal evaporation, and the patterning of the formed Ti(5 nm)/Au(150 nm) layer is conducted through a lift-off process using well-known photolithography. In addition, source electrode and drain electrode patterns may also be directly formed through printing or shadow masking instead of such a lithographic patterning process. After the formation of the source/drain contact, a SiO$_2$ layer having a thickness of 100 nm may be formed as a gate dielectric layer through plasma-enhanced chemical vapor deposition (PECVD). Furthermore, a Ti(50 nm)/Au(150 nm) layer may be formed on a gate insulator as a gate metal, and can be patterned using the same method as in the source/drain contact.

FIG. 6 is a view illustrating a process of manufacturing a TFT according to an embodiment of the present invention.

As shown in FIG. 6, first, a TiO$_2$ layer may be formed by spin-coating the above mentioned TiO$_2$ colloidal solution on a SiO$_2$/p$^+$-Si substrate or a glass substrate at a rotation speed of 5000 rpm for 30 seconds. Prior to the spin-coating of the TiO$_2$ colloidal solution, impurities may be removed from the TiO$_2$ colloidal solution by filtering the TiO$_2$ colloidal solution using a PTFE syringe filter having a pore size of 0.2 µm. Subsequently, samples of the formed TiO$_2$ layer are dried in an oven at 150° C. for 1 hour to remove residual water and solvent therefrom. Thereafter, a very thin titanium (Ti) layer may be thermally deposited on the TiO$_2$ layer at a deposition rate of 0.2 Å/sec under a pressure of $8 \times 10^{-7}$ torr. Then, RTA may be performed at 550° C. for 4 minutes, or at 800° C. for 3 minutes.

Source/drain electrodes may be formed using a photolithographic lift-off treatment. The TiO$_2$ layer/substrate may be spin-coated with a photoresist at a rotation speed of 5000 rpm for 30 seconds, and then the photoresist may be dried on a hot plate at 90° C. for 1 minute. Prior to patterning, the samples coated with the photoresist may be dipped in chlorobenzene for 5 minutes in order to realize an overhanging structure on the surface region of a photoresist film. The lift-off process can be easily conducted thanks to the overhanging structure. Further, these samples may be aligned with a photomask using a contact mask aligner (for example, UV-exposure for 9 seconds).

After the source/drain patterns of the photoresist are formed using a developer, a Ti(5 nm)/Au(150 nm) layer may be deposited thereto through thermal evaporation, and then patterned through a lift-off process using acetone. A SiO$_2$ layer having a thickness of 100 nm may be deposited at a deposition rate of 5 nm/sec through plasma-enhanced chemical vapor deposition (PECVD). Since a Ti(50 nm)/Au(150 nm) layer may be formed such that Ti is adjacent to the SiO$_2$ layer, it may be used as a gate metal, and be used to pattern the gate metal through a photolithography process, as in the case of the source/drain electrodes.

The electrical characteristics of the TFT manufactured through the above processes can be measured using a parametric analyzer. The electrical characteristics thereof will be described with reference to FIGS. 7A to 7D.

FIGS. 7A to 7D are graphs illustrating the electrical characteristics of a TFT according to an embodiment of the present invention.

FIGS. 7A to 7D show the electrical characteristics of the Ti layer having a thickness of 1 nm, which is used for the diffusion of Ti, and the TFT (device A) obtained through RTA at 550° C. for 4 minutes. This TFT has n-channel enhancement-mode characteristics, particularly pinch-off and saturation characteristics. In particular, current saturation characteristics are very important when the TFT is used as a current source, as in an active-matrix organic display (AMOLED). It again needs to be emphasized that the above mentioned diffusion of Ti is essential in realizing the transistor characteristics. TFTs having an active channel layer made only of pure TiO$_2$ without performing the Ti diffusion process do not exhibit any appreciable gate-induced modulation characteristics.

Further, it was observed that the optimal thickness of the initial Ti layer in the Ti diffusion process is important to realize a desired TFT characteristic. For example, a TFT including a Ti layer having a thickness of 7 nm and having the same process parameters as the device A exhibits gate modulation characteristics, but does not exhibit pinch-off or saturation characteristics. It is presumed that this fact is based on the bulk conductance effect caused by mobile charges of a TiO$_2$ layer having excessive concentration of Ti atoms.

Figure 7A:
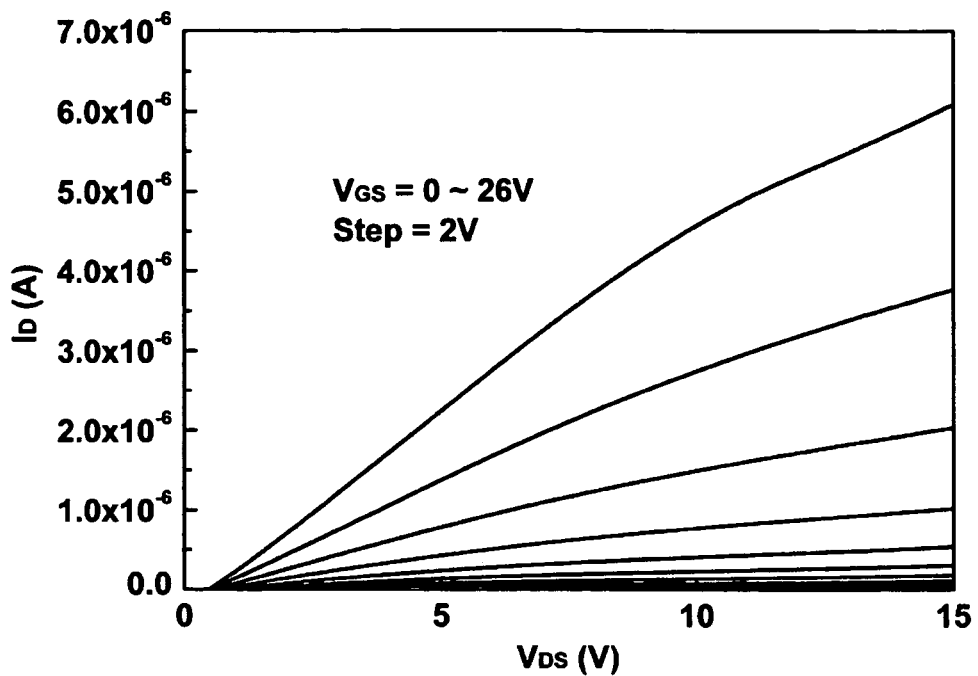
FIGS. 7A to 7D are graphs illustrating the electrical characteristics of a TFT according to an embodiment of the present invention.
Figure 7B:
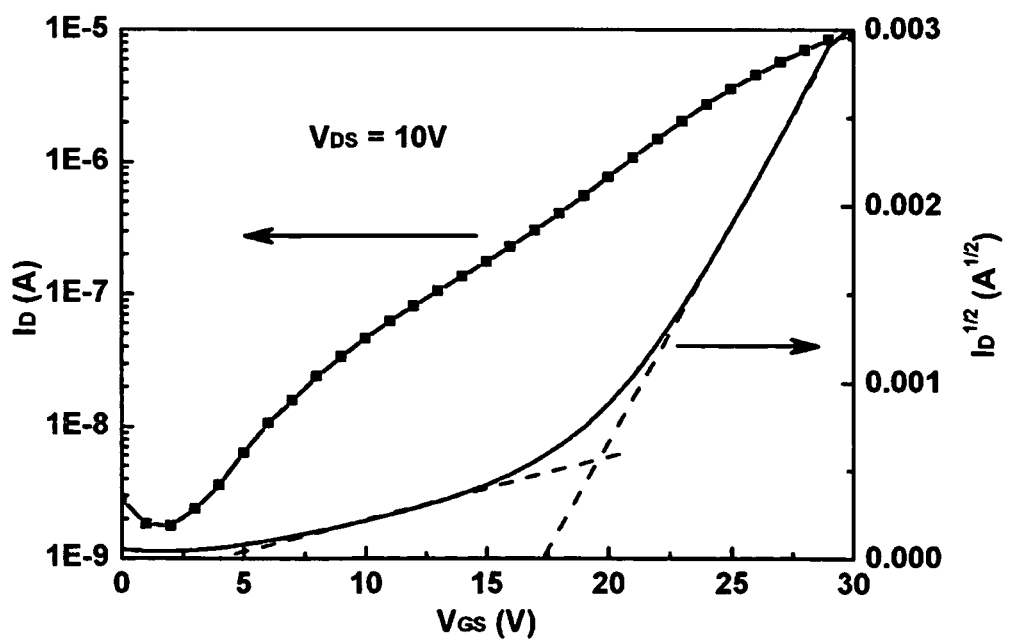

FIG. 7B is a graph showing transistor transfer characteristic curves, that is, the characteristics of the current between the source and drain electrodes in relation to the gate voltage. From the transistor transfer characteristic curves, it is estimated that saturation mobility is 0.12 cm$^2$V$^{-1}$ sec$^{-1}$ and threshold voltage is 17.5 V. Further, it is estimated that the ratio of on/off current is 5×10$^3$.

Figure 7C:
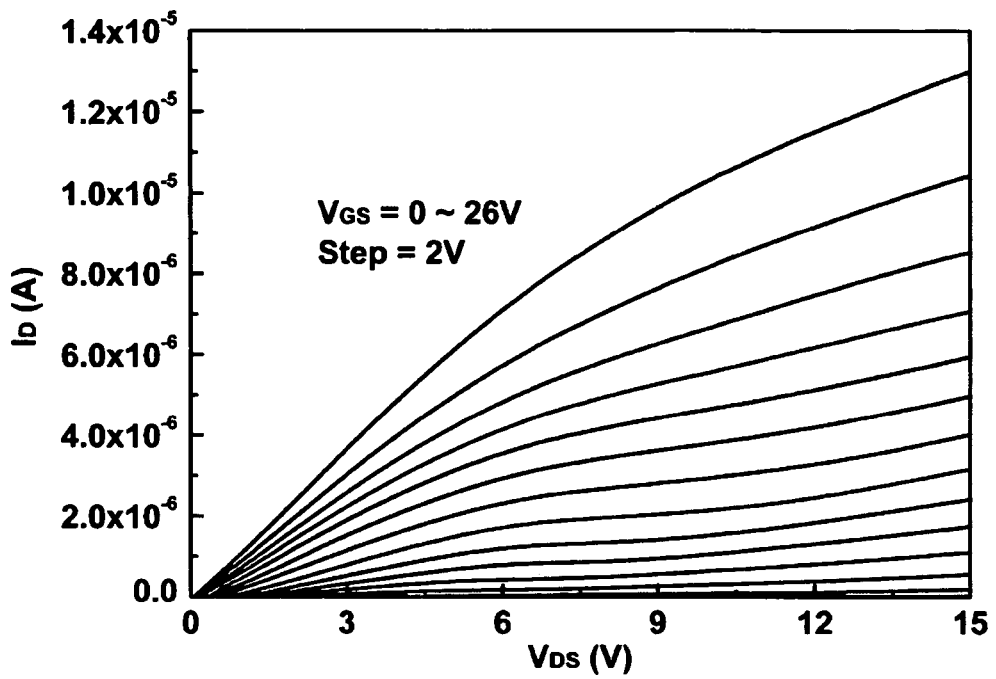
Figure 7D:
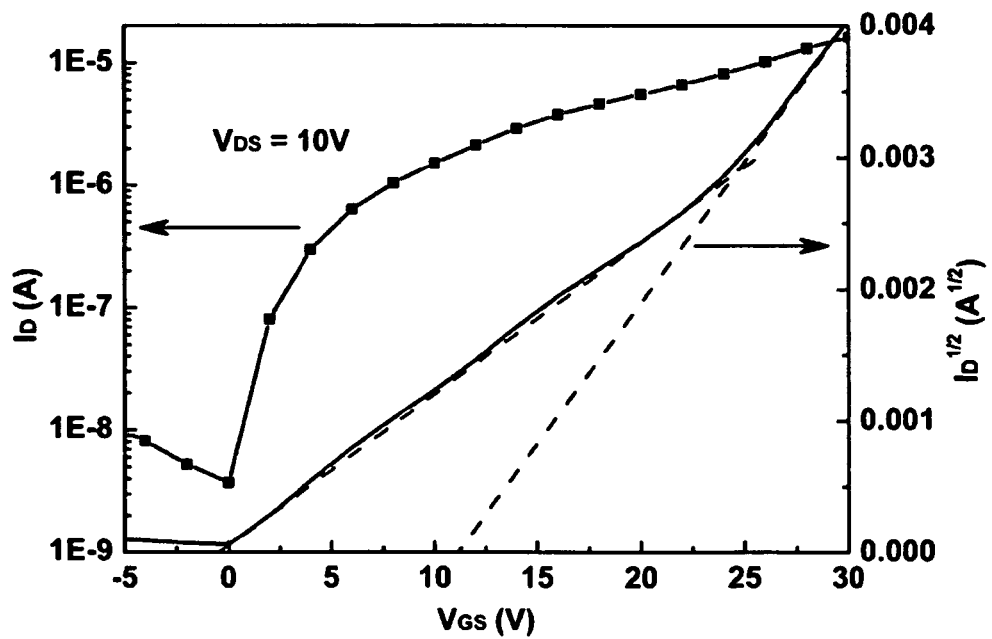

FIGS. 7C to 7D show the electrical characteristics of the TFT (device B), obtained through RTA at 800° C. for 3 minutes instead of at 550° C. for 4 minutes, in which the device B is manufactured using the same process as in the device A, except for the RTA. From the data shown in FIGS. 7C to 7D, it is estimated that saturation mobility ($\mu_e$) is 0.12 cm$^2$V$^{-1}$ sec$^{-1}$, threshold voltage (V$_{th}$) is 11 V, and that the ratio of on/off current is 4×10$^3$. Here, other parameters of device B are nearly the same as those of device A, but the threshold voltage (V$_{th}$) of device B is clearly different from that of device A. Therefore, it can be presumed that trap density is decreased due to the high-temperature RTA process.

The thin film transistor (TFT) according to an embodiment of the present invention includes an active channel layer having a thin TiO$_2$ layer, and was successfully realized. The thin film transistor (TFT) according to an embodiment of the present invention is realized by annealing a very thin Ti layer, located on the TiO$_2$ layer, thus diffusing Ti atoms into the TiO$_2$ layer. Once traps are filled with the carriers supplied by these Ti atoms, most gate-induced carriers can contribute to the conduction of channels. Meanwhile, it was observed that the threshold voltage was decreased in the high-temperature RTA process. The decrease in threshold voltage can also be influenced by the decrease in initial trap density.

The results described in this embodiment provide a general approach to improve the performance of MOxTFTs as well as to extend the kinds of raw materials that can be used as active layers in MOxTFTs. Considering that TiO$_2$ is a cheap and environment-friendly material that can be produced in large quantities and that TiO$_2$ nanoparticles colloidal solution is easily processed from solution, it is expected that the thin film transistor (TFT) according to an embodiment of the present invention can be applied in various fields, as well as in new fields such as transparent electronic devices. The performance of the titanium oxide-based TFT can be further improved by optimizing a manufacturing process and utilizing many growth technologies for forming a thin TiO$_2$ layer. For example, when TiO$_2$ nanowires are arranged in parallel between a source channel and a drain channel, charges may be transported with less scattering, thus greatly increasing the charge mobility.

As described above, the present invention is advantageous in that a thin film transistor can be manufactured at low cost by forming polycrystalline or amorphous titanium oxides, which are abundant on the Earth and are extremely easy to form into a thin film as an active layer of TFTs.

Further, the present invention is advantageous in that the harmful environmental problems of conventional thin film transistors can be solved by forming titanium oxides, which are environment-friendly materials, into an active layer of a thin film transistor.

Further, the present invention is advantageous in that the performance of a thin film transistor, including high charge mobility and resistance to air or moisture, can be improved by forming titanium oxides into an active layer of a thin film transistor.

Furthermore, the present invention is advantageous in that it can be widely applied to specific electronic apparatuses in which electronic elements and circuits are made invisibly forming transparent titanium oxides into an active layer of a thin film transistor.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A thin film transistor, comprising:
    a substrate;
    an active layer formed on the substrate using polycrystalline or amorphous titanium oxides as a main component; and
    an insulating layer formed on the active layer, wherein the active layer is formed with oxygen-vacancy-controlled titanium oxides by controlling an oxygen vacancy of the polycrystalline or amorphous titanium oxides during a coating process.

2. The thin film transistor according to claim 1, further comprising:
    a gate electrode formed on the insulating layer; and
    a source electrode and a drain electrode formed on the substrate and covered with the active layer.

3. The thin film transistor according to claim 1, further comprising:
    a gate electrode formed on the insulating layer; and
    a source electrode and a drain electrode formed on the active layer and covered with the insulating layer.

4. The thin film transistor according to claim 1, wherein the active layer is formed with a Ti-doped TiO$_x$ layer obtained by diffusing titanium (Ti) atoms into polycrystalline or amorphous titanium oxides (TiO$_x$, 0≦2) layer.

5. The thin film transistor according to claim 4, wherein the Ti-doped TiO$_x$ layer is obtained by forming a titanium (Ti) layer on the titanium oxide layer through a thermal evaporation process and then performing treatment through a thermal annealing process.

6. The thin film transistor according to claim 1, wherein the titanium oxides are any kind of oxides formed by oxidizing titanium, and the titanium oxides are represented by TiO$_x$ (0<x≦2).

7. The thin film transistor according to claim 6, wherein the active layer is formed using N-type titanium oxides or P-type titanium oxides, obtained through an impurity doping process of mixing oxides or metals with the titanium oxides.

8. The thin film transistor according to claim 1, wherein the coating process is one of spin coating, dip coating, imprinting, stamping, printing, transfer printing, self-assembly, chemical vapor deposition, room-temperature or high-temperature deposition, thermal evaporation, electron beam evaporation, sputtering, atomic layer deposition, and pulsed laser deposition (PLD).

9. The thin film transistor according to claim 1, wherein the substrate is formed using any one of a silicon substrate, a semiconductor substrate, a glass substrate, a plastic substrate, metal foil, fabric, and paper.

10. A thin film transistor, comprising:
a substrate;
an insulating layer formed on the substrate; and
an active layer formed on the insulating layer using polycrystalline or amorphous titanium oxides as a main component, wherein the active layer is formed with oxygen-vacancy-controlled titanium oxides by controlling an oxygen vacancy of the polycrystalline or amorphous titanium oxides during a coating process.

11. The thin film transistor according to claim 10, further comprising:
a gate electrode formed on the substrate and covered with the insulating layer; and
a source electrode and a drain electrode formed on the active layer.

12. The thin film transistor according to claim 10, further comprising:
a gate electrode formed on the insulating layer and covered with the active layer; and
a source electrode and a drain electrode formed on the insulating layer.

13. A thin film transistor, comprising:
a substrate; and
an active layer formed on the substrate using polycrystalline or amorphous titanium oxides as a main component, wherein the active layer is formed with oxygen-vacancy-controlled titanium oxides by controlling an oxygen vacancy of the polycrystalline or amorphous titanium oxides during a coating process.

14. The thin film transistor according to claim 13, further comprising:
a gate electrode formed on the active layer; and
a source electrode and a drain electrode formed on the substrate and covered with the active layer.

15. The thin film transistor according to claim 13, further comprising:
a gate electrode formed on the active layer; and
a source electrode and a drain electrode formed on the active layer such that they are disposed at one side and another side of the gate electrode, respectively, at a certain interval.

16. The thin film transistor according to claim 13, further comprising:
a gate electrode formed on the substrate and covered with the active layer; and
a source electrode and a drain electrode formed on the active layer.

17. The thin film transistor according to claim 13, further comprising:
a gate electrode formed on the substrate and covered with the active layer; and
a source electrode and a drain electrode formed on the substrate and covered with the active layer such that they are disposed at one side and other side of the gate electrode at a certain interval, respectively.

18. The thin film transistor according to claim 13, wherein the active layer is formed with a Ti-doped $TiO_x$ layer obtained by diffusing titanium (Ti) atoms into polycrystalline or amorphous titanium oxides ($TiO_x$, $0 \leq 2$) layer.

19. The thin film transistor according to claim 18, wherein the Ti-doped $TiO_x$ layer is obtained by forming a titanium (Ti) layer on the titanium oxide layer through a thermal evaporation process and then performing treatment through a thermal annealing process.

20. The thin film transistor according to claim 13, wherein the titanium oxides are any kind of oxides formed by oxidizing titanium, and the titanium oxides are represented by $TiO_x$ ($0 < x \leq 2$).

21. The thin film transistor according to claim 20, wherein the active layer is formed using N-type titanium oxides or P-type titanium oxides, obtained through an impurity doping process of mixing oxides or metals with the titanium oxides.

22. The thin film transistor according to claim 10, wherein the active layer is formed with a Ti-doped $TiO_x$ layer obtained by diffusing titanium (Ti) atoms into polycrystalline or amorphous titanium oxides ($TiO_x$, $0 \leq 2$) layer.

23. The thin film transistor according to claim 22, wherein the Ti-doped $TiO_x$ layer is obtained by forming a titanium (Ti) layer on the titanium oxide layer through a thermal evaporation process and then performing treatment through a thermal annealing process.

24. The thin film transistor according to claim 10, wherein the titanium oxides are any kind of oxides formed by oxidizing titanium, and the titanium oxides are represented by $TiO_x$ ($0 < x \leq 2$).

25. The thin film transistor according to claim 24, wherein the active layer is formed using N-type titanium oxides or P-type titanium oxides, obtained through an impurity doping process of mixing oxides or metals with the titanium oxides.

* * * * *